United States Patent
Groe (10) Patent No.: US 8,095,087 B1
(45) Date of Patent: Jan. 10, 2012

(54) POLAR MODULATION WITH COARSE AND FINE FM SIGNALS

(75) Inventor: John B. Groe, Poway, CA (US)

(73) Assignee: Quintic Holdings, Santa Clara, CA (US)

(*) Notice: Subject to any disclaimer, the term of this patent is extended or adjusted under 35 U.S.C. 154(b) by 492 days.

(21) Appl. No.: 12/328,670

(22) Filed: Dec. 4, 2008

Related U.S. Application Data (60) Provisional application No. 60/992,294, filed on Dec. 4, 2007.

(51) Int. Cl.
*H04B 1/04* (2006.01)

(52) U.S. Cl. ........ 455/110; 455/112; 455/113; 332/103; 332/145

(58) Field of Classification Search ............... 455/110, 455/113, 112; 332/103, 145
See application file for complete search history.

(56) References Cited

U.S. PATENT DOCUMENTS

| | | | |
|---|---|---|---|
| 6,774,440 B1 * | 8/2004 | Shibata et al. | 257/369 |
| 6,985,703 B2 * | 1/2006 | Groe et al. | 455/108 |
| 7,764,139 B1 * | 7/2010 | Groe | 332/145 |

* cited by examiner

*Primary Examiner* — Kenneth B. Wells
(74) *Attorney, Agent, or Firm* — Blairtech Solution LLC (57) ABSTRACT

Apparatus and methods for enhancement of performance in polar modulators are described. In one implementation, an FM signal component is divided into a coarse FM signal and a residue FM signal to be applied to a VCO for generation of a modulation signal. The coarse FM signal may be proportional to a threshold value when the FM signal exceeds the threshold, while the residue FM signal may be proportional to the difference between the FM signal and coarse FM signal.

28 Claims, 8 Drawing Sheets

An Embodiment of FM Splitting

FIG. 1
WCDMA Transmit Signal
Plotted on Complex Plane

FIG. 2
Simple Polar Transmitter
(Prior Art)

FIG. 3(a)
Diagram of Delta-Sigma Modulator
(Prior Art)

FIG. 3(b)
Noise Contribution of Delta-Sigma
Modulator of FIG. 3(a)

FIG. 4(a)
Phase/Frequency Modulation
System
(Prior Art)

FIG. 4(b)
Response of Each FM Path

FIG. 5(a)
Dual Port VCO
(Prior Art)

FIG. 5(b)
Response at Modulation Port

FIG. 6
FM for a Typical WCDMA Signal

FIG. 7(a)
An Embodiment of FM Splitting

FIG. 7(b)
A Modified VCO

FIG. 7(c)
Resulting Digital and Analog Signals

POLAR MODULATION WITH COARSE AND FINE FM SIGNALS

CROSS-REFERENCE TO RELATED APPLICATIONS

This application claims priority under 35 U.S.C. §119(e) to U.S. Provisional Patent Application Ser. No. 60/992,294, entitled POLAR MODULATION WITH FM SPLITTING, filed on Dec. 4, 2007. This application is also related to U.S. Utility Pat. No. 6,985,703, entitled DIRECT SYNTHESIS TRANSMITTER, issued Jan. 10, 2006, to U.S. Utility Pat. No. 6,774,440 entitled SYSTEM FOR HIGHLY LINEAR PHASE MODULATION, issued Aug. 10, 2004, to U.S. Utility Pat. No. 7,764,139, entitled POLAR MODULATION WITH EXTENDED AM, issued Jul. 27, 2010, to U.S. Utility patent application Ser. No. 12/251,342, entitled APPARATUS AND METHODS FOR FM PULSE SHAPING, filed Oct. 14, 2008, to U.S. Utility patent application Ser. No. 12/249,725 entitled APPARATUS AND METHODS POLAR MODULATION WITH IQ ZEROING, filed Oct. 10, 2008, and to U.S. Utility Pat. No. 7,675,379, entitled LINEAR WIDEBAND PHASE MODULATION SYSTEM, filed Mar. 9, 2010. The content of each of these applications is hereby incorporated by reference herein in its entirety for all purposes.

FIELD OF THE INVENTION

The present invention relates generally to radio transmitters using polar modulation. More particularly but not exclusively, the present invention relates to apparatus and methods for reducing peak analog deviation to improve performance and ease voltage controlled oscillator (VCO) design requirements.

BACKGROUND

Radio transmitters are used to generate the modulated signals required for wireless communications using modulation techniques such as QPSK, 8-PSK, 16-QAM, 64-QAM, and OFDM to vary the amplitude, phase, and/or frequency of the transmitter's RF carrier.

The modulated signal represents and conveys the message data consisting of in phase (I) and quadrature (Q) data streams. In practice, these data streams pass through digital filters that shape the resulting pulses and ultimately define the spectrum of the modulated transmit signal. A polar transmitter translates these I and Q data streams to equivalent amplitude (AM) and phase (PM) modulation signals. This allows these signals to be applied at more advantageous points in the transmitter increasing its efficiency.

Figure 1:
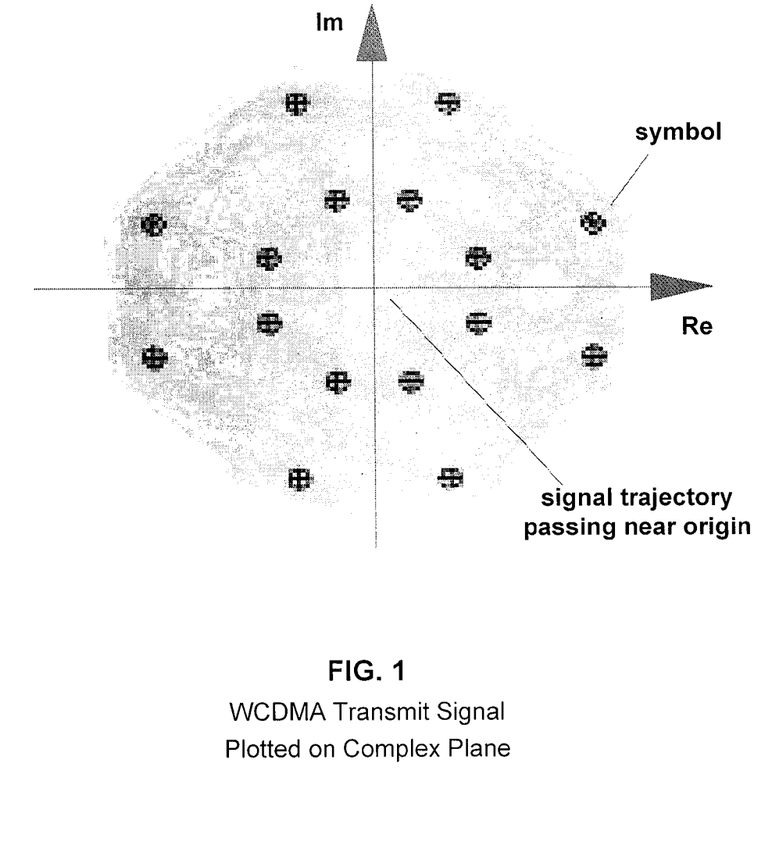
FIG. 1 shows the complex signal trajectory for a WCDMA transmit signal.

The PM signal is applied to the RF carrier at a phase-locked loop (PLL). In practice, this is actually accomplished using the equivalent frequency modulation (FM) signal, which is easily found by differentiating the PM signal. Unfortunately, the differentiation process widens the bandwidth of the FM signal and also generates impulses. This is due to the fact that the phase jumps by as much as $\pi$ whenever the transmit signal passes through or near the origin of the complex plane as shown in FIG. 1. The resulting FM impulses (that occur after differentiating the phase jumps), although infrequent, can be as strong as one-half of the data rate.

The FM signal's impulses and wide bandwidth present daunting challenges to the design of the polar transmitter. Any distortion of the FM signal alters the spectrum of the VCO output, elevates the noise floor around the transmit signal, and rotates the complex signal pattern. Practical circuits invariably reduce the bandwidth of the FM signal and degrade performance. More importantly, the VCO and PLL limit the peak FM deviation and corrupt the transmit output spectrum. It would therefore be advantageous to reduce the peak FM deviation as well as the bandwidth of the FM signal.

SUMMARY

In one or more embodiments of the present invention, apparatus and methods for dividing an FM signal in a polar modulation transmitter into a coarse digital term and a fine analog residue to better realize the large frequency deviations required of the VCO and phase/frequency modulator are described.

In one aspect, the present invention relates to a method for processing an FM signal component of a polar modulation signal, comprising comparing the FM signal to a threshold value, and, responsive to said comparing, generating a residue FM signal, wherein said residue FM signal is proportional to the difference between said FM signal and said threshold value when said FM signal exceeds said threshold value and proportional to the FM signal when said FM signal is less than said threshold value.

In another aspect, the present invention relates to a method for processing an FM signal component of a polar modulation signal, comprising comparing the FM signal to one of a plurality of threshold values, and, responsive to said comparing, generating a residue FM signal, wherein said residue FM signal is proportional to the difference between said FM signal and one or more of said plurality of threshold values when said FM signal exceeds one or more of said threshold values and proportional to the FM signal when said FM signal is less than said one or more threshold values.

In yet another aspect the present invention relates to an Apparatus for processing an FM signal component of a modulation signal in a polar modulator, comprising a detection circuit configured to determine when the FM signal exceeds a threshold value, a coarse FM signal generation circuit configured to generate, responsive to said determining, a coarse FM signal representative of said threshold value when said FM signal exceeds said predetermined threshold, and a residue FM signal generation circuit configured to generate, responsive to said determining, a residue FM signal having a value proportionate to the difference between said FM signal and said threshold value when said FM signal exceeds said threshold value.

In yet another aspect, the present invention relates to an Apparatus for processing an FM signal component of a modulation signal in a polar modulator, comprising a detection circuit configured to determine when the FM signal exceeds a threshold value, a coarse signal generation circuit configured to generate, responsive to said determining, one or more coarse FM signals representative of a plurality of threshold values when said FM signal exceeds one or more predetermined thresholds, and a residue signal generation circuit configured to generate, responsive to said determining, a residue FM signal having a value proportionate to the difference between said FM signal and one of said plurality of threshold values when said FM signal exceeds said plurality of threshold values.

Additional aspects of the present invention are described below with respect to the appended drawings.

BRIEF DESCRIPTION OF THE DRAWINGS

The following is a brief description of the drawings wherein.

DETAILED DESCRIPTION

Figure 2:
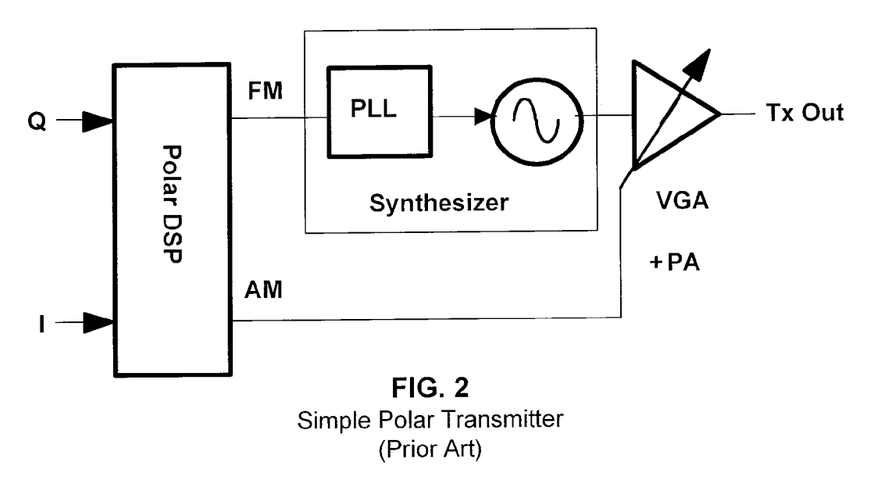
FIG. 2 shows a diagram of simple polar transmitter.

A simple diagram of a polar transmitter is shown in FIG. 2. It synthesizes the transmit signal using direct phase modulation at the synthesizer and amplitude modulation at the variable gain amplifier (VGA) or power amplifier (PA).

Figure 3A:
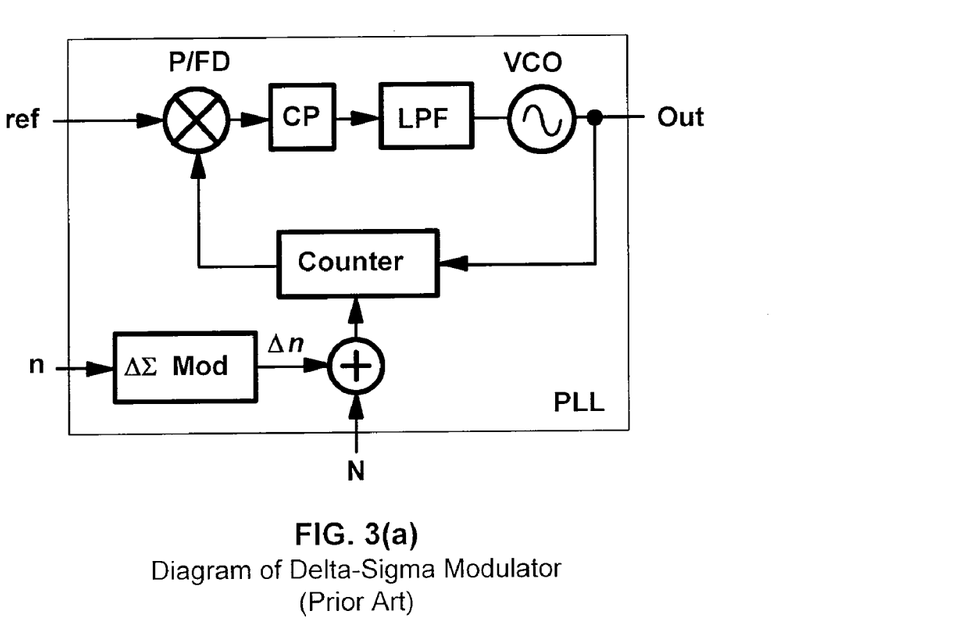
FIG. 3(a) shows a diagram of a fractional-N PLL with a Δ modulator.

FIG. 3(a) shows a fractional-N phase-locked loop (PLL) used to synthesize the radio frequency (RF) carrier signal. The PLL forms a feedback system that consists of a voltage-controlled oscillator (VCO), N counter, phase/frequency detector (P/FD), charge pump (CP), and integration filter.

The PLL uses negative feedback to force the phase of the feedback signal to track the phase of the reference signal. As a result, the VCO oscillates at a frequency given by $$f_{VCO} = f_{REF}(N+n)$$

where n represents the fractional value and N equals the integer value.

The fractional-N phase-locked loop resolves fine frequency steps by modulating the value of Δn so that its average value satisfies $$n = \frac{\Delta f}{f_{REF}} = \frac{1}{M}\sum_{i=1}^{M}\Delta n_i$$

The ΔΣ modulator forms a sequence of Δn values with these important properties: 1) it responds to the input n quickly, 2) it possesses a resolution that improves with the number of samples, and 3) it concentrates quantization noise at high frequencies, near one-half the clock frequency.

The quantization noise can be attributed to the integer nature of the feedback counter. It possesses a quantization error of ±½ around Nor $$\Delta = \frac{1}{N}$$

Assuming a uniform distribution of this error leads to the noise spectral density function described by $$e_{rms}^2(f) = \frac{1}{12N^2 f_{REF}}$$

The ΔΣ modulator found in this polar transmitter shapes the quantization noise according to the transfer function $$\Delta\Sigma(z) = (1-z^{-1})^L$$

where L is the order of the modulator. It in turn feeds the feedback counter, which acts a digital accumulator and reduces its noise-shaping effects. That is, the feedback counter operates in such a way that the current output phase depends on its previous output phase. As a result, the transfer function of the feedback counter or prescalar becomes $$P(z) = 2\pi \frac{z^{-1}}{1-z^{-1}}$$

Combining the above equations shows that the noise at the output of the feedback counter equals $$n^2(f) = e_{rms}^2(f)[\Delta\Sigma(f)]^2[P(f)]^2 \text{ which simplifies to}$$

$$n^2(f) = \frac{1}{3}\frac{\pi^2}{N^2 f_{REF}}\left[2\sin\left(\frac{\pi f}{f_{REF}}\right)\right]^{2(L-1)}$$

Figure 3B:
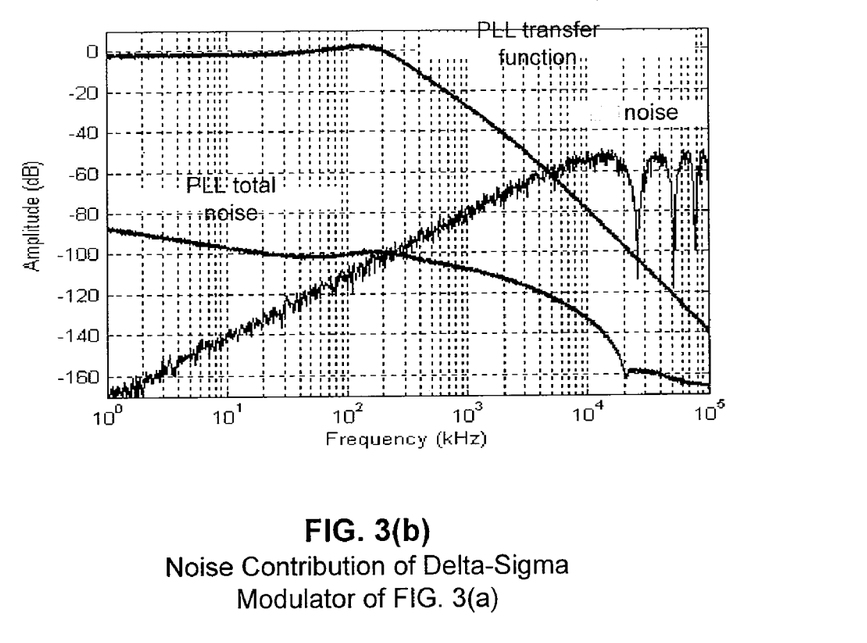
FIG. 3(b) shows noise contributions of the Δ modulator of FIG. 3(a)

Ultimately, this noise must be attenuated by the loop filter and PLL transfer function to avoid excessive ΔΣ noise at the output of the PLL as shown in FIG. 3(b).

Figure 4A:
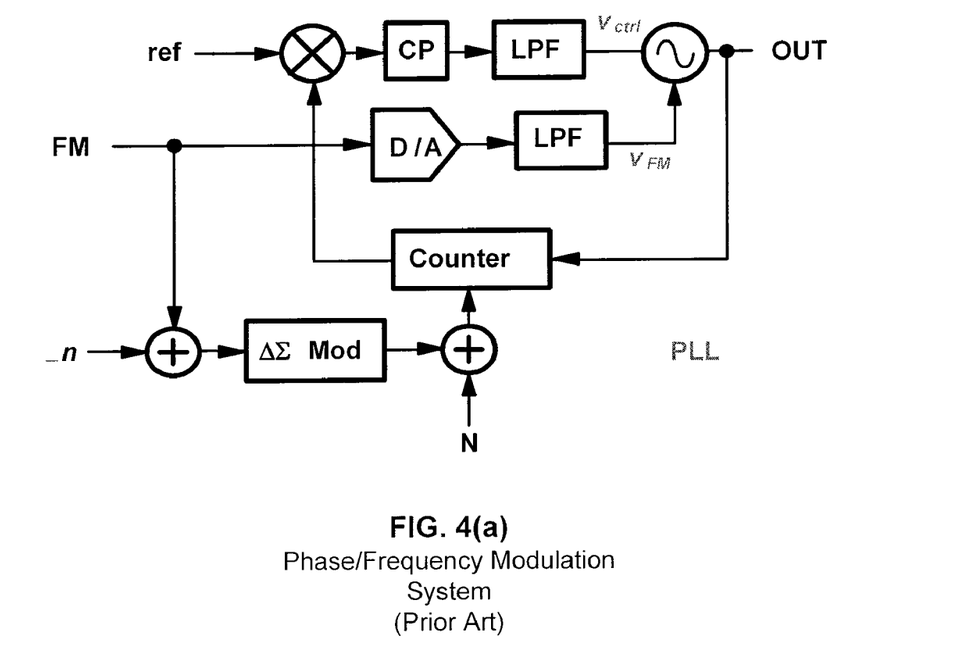
FIG. 4(a) shows a phase/frequency modulator.
Figure 4B:
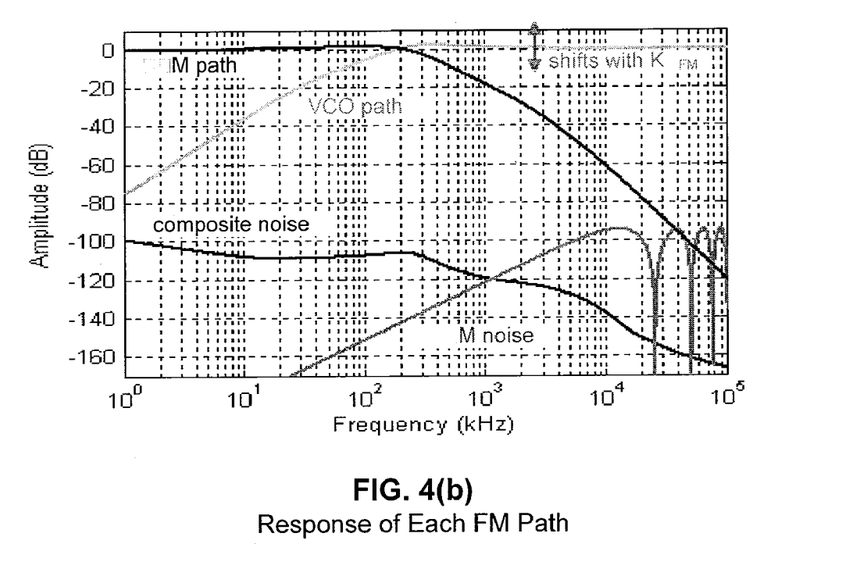
FIG. 4(b) shows the responses associated with each of the modulation paths of the modulator of FIG. 4(a)

To support wideband direct phase/frequency modulation, the fractional-N phase-locked loop adds a direct path to the VCO as shown in FIG. 4(a). This modifies the VCO output to $$v_{out}(t) = A\cos[\omega t + K_{VCO}\int v_{ctrl}(t)dt + K_{FM}\int v_{FM}(t)dt]$$

where $K_{VCO}$ and $K_{FM}$ represent the sensitivity of the control port and the direct frequency modulation port, respectively. The FM signal also feeds the ΔΣ modulator and the feedback counter. This results in two paths for the FM signal as illustrated in FIG. 4(b) and described by the transfer functions $$\Delta f = \frac{K_{PD}Z(s)K_V}{sN + K_{PD}Z(s)K_V}FM \quad \Delta f = \frac{sNK_{FM}}{sN + K_{PD}Z(s)K_V}\alpha FM$$

where $K_{PD}$ is the charge pump's gain, $Z(s)$ is the impedance presented by the loop filter, $K_V$ is the VCO's sensitivity at the tuning port, N is the value of the feedback counter, $K_{FM}$ is the VCO's gain at the modulation port, and α is a scaling parameter. Ideally, these two functions combine to realize a flat response. That is, the ΔΣM path's response transitions smoothly to the VCO path's response and holds their combination at unity (0 dB). By its nature, the frequency modulation developed through the ΔΣ modulator is exact while, in contrast, the modulation formed at the VCO is sensitive to its gain $K_{FM}$ and the accuracy of scaling parameter α.

Figure 5A:
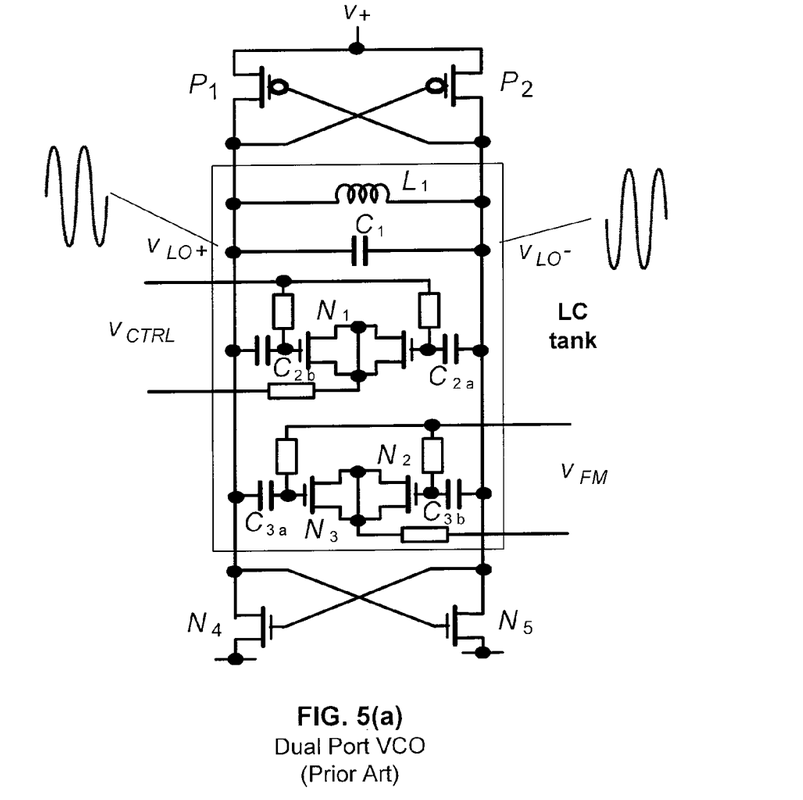
FIG. 5(a) shows a dual port VCO.
Figure 5B:
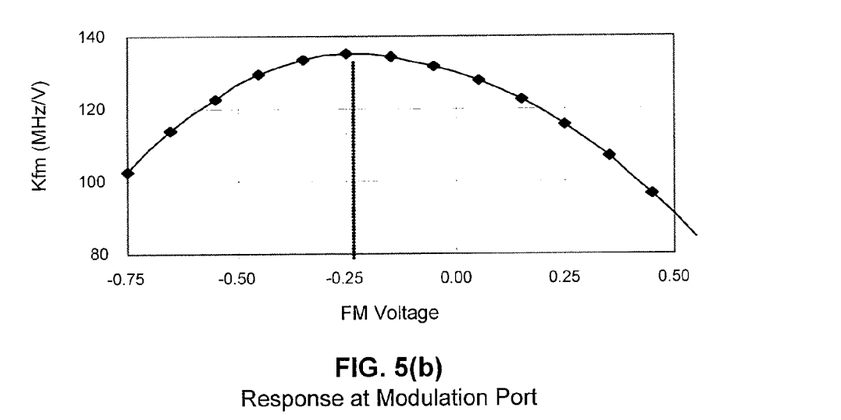
FIG. 5(b) shows the response at the modulation port for the VCO of FIG. 5(a)

A key component of a direct phase/frequency modulator is a VCO such as the one shown in FIG. 5(a). It uses complementary MOS devices to replenish the losses in the Le resonator. The Le resonator consists of a differential inductor, coarse-tuning capacitors (not shown), and two variable capacitance structures based on accumulation mode MOSFET devices. The accumulation-mode devices normally display an abrupt response, but impressing the large VCO signal across two back-to-back devices tends to linearize the response as shown in FIG. 5(b). This is particularly important for wideband frequency modulation.

Figure 6:
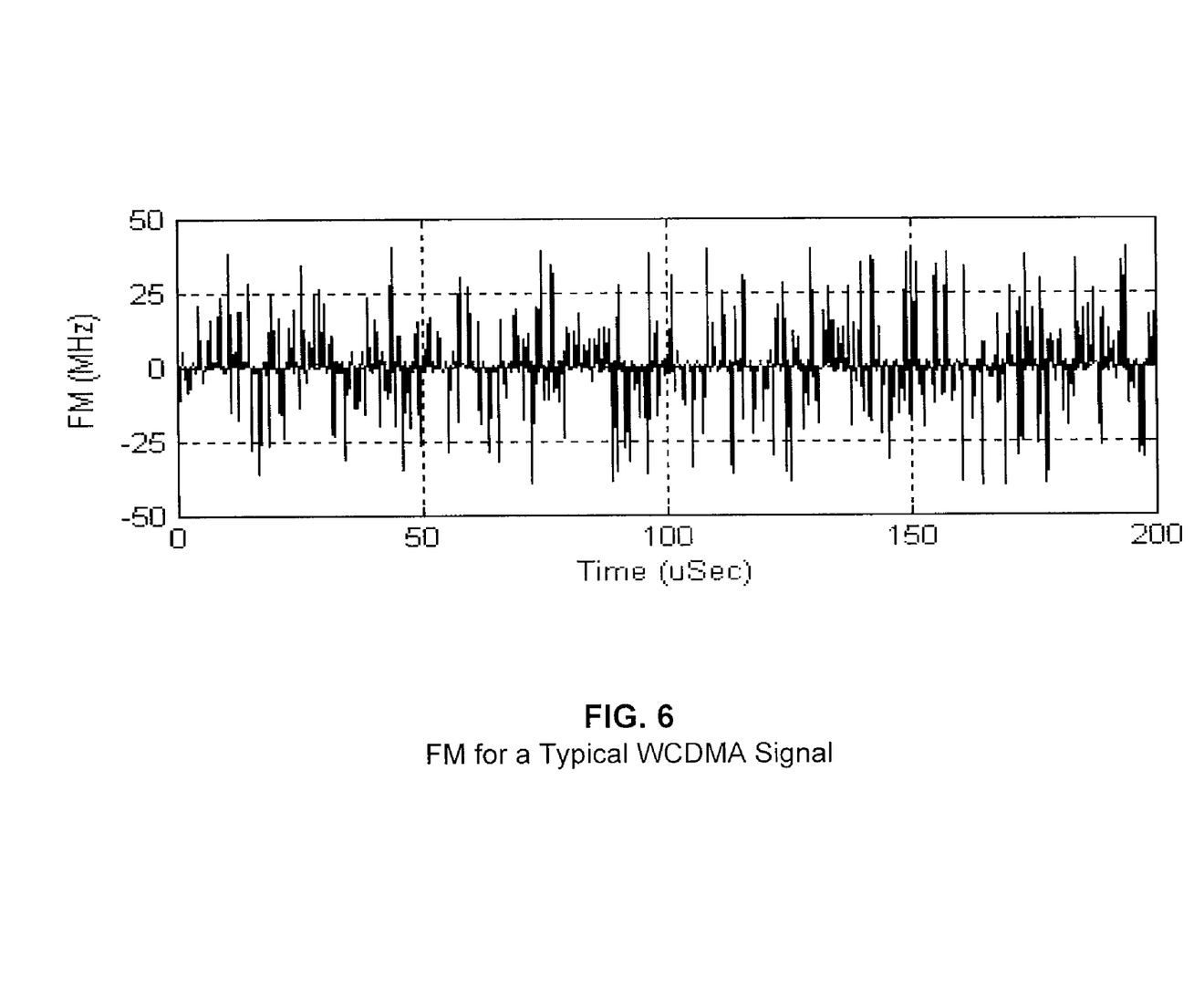
FIG. 6 shows the FM signal component for a typical WCDMA transmit signal.

By design, signals applied to the control and modulation ports change the phase/frequency of the VCO output. Unfortunately, the VCO cannot discriminate between intended signals and noise. It therefore becomes important to minimize the noise as well as the sensitivity of these ports. Adding coarse-tuning capacitors to subdivide the VCO range lowers the sensitivity of the control port. Unfortunately, the nonlinear operations that formed the FM signal produce impulses as strong as one-half the FM data rate as shown in FIG. 6.

In accordance with aspects of the present invention, it is possible to realize these strong FM impulses by applying a split FM concept. This approach splits the FM signal into a coarse term $FM_{dig}$ and a fine residue $\Delta FM$ where $$FM = FM_{dig} + \Delta FM$$

In practice, the coarse term may be realized using switched capacitors similar to the coarse-tuning capacitors already found in the VCO. The fine component may then be translated to an analog signal to drive the modulation port.

Figure 7A:
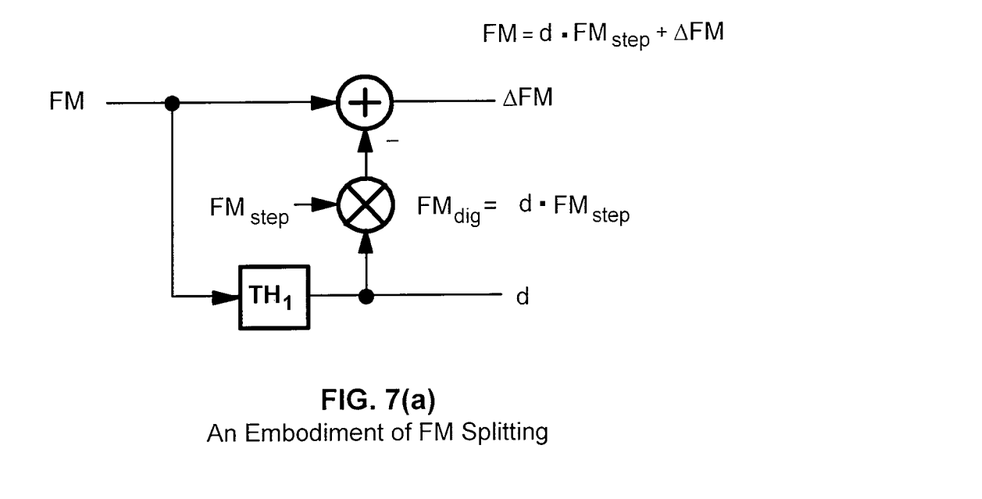
FIG. 7(a) shows an embodiment of FM splitting in accordance with aspects of the present invention.
Figure 7B:
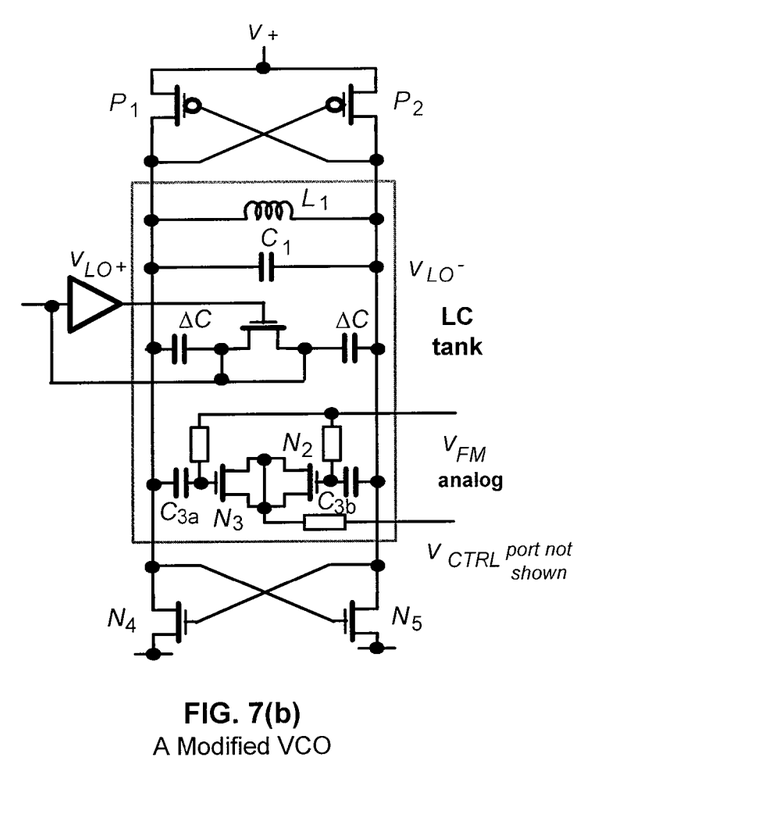
FIG. 7(b) shows an embodiment of a modified VCO in accordance with aspects of the present invention.
Figure 7C:
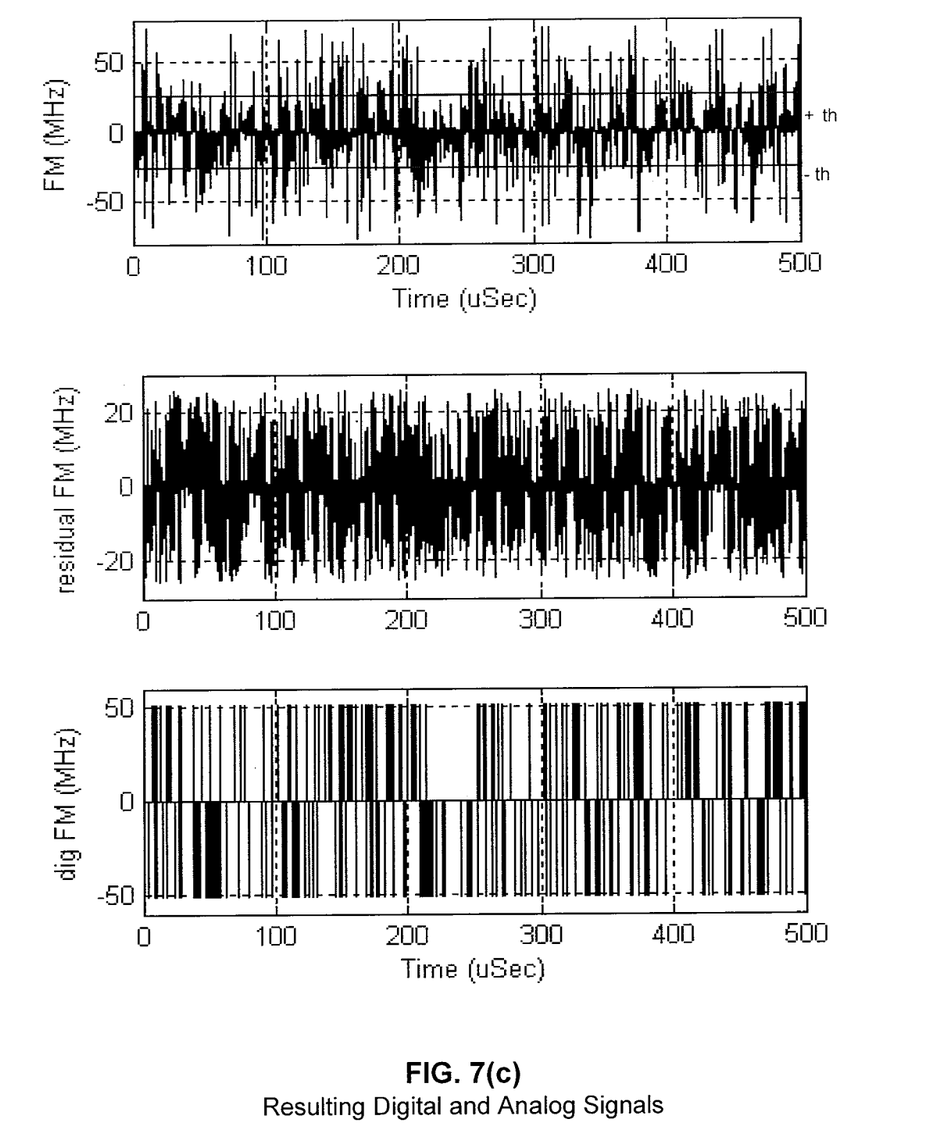
FIG. 7(c) shows resulting digital and analog signals for an embodiment of the present invention.

FIG. 7(a) illustrates one embodiment of a network for splitting the FM signal in accordance with aspects of the invention. As shown in FIG. 7(a), the FM signal may be compared to the threshold $\pm TH_1$ to produce a digital data stream d representing the coarse signal, an adjustment signal, and the residue analog signal $\Delta FM$. The digital data stream may then be used to control the switched capacitors $\Delta C$, shown in FIG. 7(b), to shift the frequency of the VCO, $$\Delta f = \pm \frac{2}{3}\max(FM)$$

also known as $FM_{dig}$. In one embodiment, this approach may be used to advantageously reduce the residual analog signal $\Delta FM$ to one-third its original amplitude as shown in FIG. 7(c); however, other division ratios may also be used in various embodiments. It follows that the threshold equals $$TH_1 = \pm \frac{1}{3}\max(FM)$$

for the embodiment shown.

In practice, the VCO oscillates at the resonance frequency for the LC tank described by $$f_c - \Delta f = \frac{1}{2\pi\sqrt{L(C + \Delta C)}}$$

where $f_c$ represents the (un-modulated) carrier frequency and $\Delta f$ corresponds to the frequency deviation or step caused by $\Delta C$. This can be approximated by $$\Delta f \approx f_c \left(\frac{\Delta C}{C}\right)$$

when $\Delta C$ is much smaller than $C$. As seen, the frequency step $\Delta f$ varies with the frequency $f_c$ and the capacitances $\Delta C$ and $C$. To properly split the FM signal, $\Delta f$ must be adjusted or at least known.

Additional threshold steps may also be used. For example, a second set of thresholds at $\pm TH_2$ may be used to further reduce the range of $\Delta FM$ to about ⅑th its original amplitude, or to other proportionately smaller ratios.

Embodiments of this FM splitting approach may be used to scale the analog FM signal, easing the design of the VCO and its modulation port while preserving the FM impulses associated with wideband modulation.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

I claim:

1. A method for processing an FM signal of a polar modulation signal, comprising:
   comparing the FM signal to a threshold value;
   responsive to said comparing, generating a digital data stream representing a coarse FM signal, wherein the coarse FM signal is:
       proportional to a value represented by the digital data stream when the FM signal is greater than the threshold value; and
       zero-valued when the FM signal is less than the threshold value; and generating a residue FM signal corresponding to the difference between the FM signal and the coarse FM signal.

2. The method of claim 1 wherein the residue FM signal is generated by subtracting the value represented by the digital data stream scaled by an adjustment signal from the FM signal to generate the residue FM signal.

3. The method of claim 2 wherein the adjustment signal is based on an FM step value and the threshold value when the FM signal is greater than the threshold value.

4. The method of claim 1 wherein said comparing comprises comparing the magnitude of the FM signal to a threshold magnitude value.

5. The method of claim 1 further comprising applying the digital data stream to control switched capacitors associated with coarse-tuning capacitors of a VCO.

6. The method of claim 1 further comprising translating the residue FM signal to an analog signal to drive a modulation port of a VCO.

7. A method for processing an FM signal of a polar modulation signal, comprising:
   comparing the FM signal to one or more threshold values;
   responsive to said comparing, generating one or more digital data streams representing one or more coarse FM signals, wherein said one or more coarse FM signals are:

proportional to one or more values represented by said one or more digital data streams when the FM signal is greater than said one or more threshold values respectively; and zero-valued when the FM signal is less than said one or more threshold values respectively; and generating a residue FM signal corresponding to the difference between the FM signal and said one or more coarse FM signals.

8. The method of claim 7 wherein said residue FM signal is generated by subtracting said one or more values represented by said one or more digital data streams respectively scaled by one or more adjustment signals from the FM signal to generate the residue FM signal.

9. The method of claim 8 wherein said one or more adjustment signals are based on one or more FM step values and said one or more threshold values when the FM signal is greater than said one or more threshold values respectively.

10. The method of claim 7 wherein said comparing comprises comparing the magnitude of the FM signal to the magnitudes of said one or more threshold values.

11. The method of claim 7 further comprising applying said one or more digital data streams to control switched capacitors associated with coarse-tuning capacitors in a VCO.

12. The method of claim 7 further comprising translating the residue FM signal to an analog signal to drive a modulation port of a VCO.

13. An Apparatus for processing an FM signal of a modulation signal in a polar modulator, comprising:
 a detection circuit configured to determine when the FM signal exceeds a threshold value;
 a coarse FM signal generation circuit configured to generate, responsive to said determining, a digital bit stream representing the coarse FM signal when the FM signal exceeds the threshold value; and
 a residue FM signal generation circuit configured to generate a residue FM signal corresponding to the difference between the FM signal and the coarse FM signal.

14. The Apparatus of claim 13 wherein the digital bit stream and the residue FM signal are provided to a voltage controlled oscillator (VCO) circuit to facilitate generation of a transmit modulation signal.

15. The Apparatus of claim 14 further comprising a switching circuit configured to switch, responsive to the digital bit stream, a tuned frequency of the VCO circuit.

16. The Apparatus of claim 15 wherein the switching circuit comprises two or more coarse tuning capacitors.

17. The Apparatus of claim 14 wherein the residue FM signal is provided to a tuning port of the VCO.

18. The Apparatus of claim 13 wherein the threshold value is set to a predetermined fixed value.

19. The Apparatus of claim 13 wherein the threshold value is set to a value proportional to a full-scale signal range of the FM signal.

20. The Apparatus of claim 19 wherein the threshold value is set to approximately two thirds of the full-scale signal range of the FM signal.

21. The Apparatus of claim 19 wherein the threshold value is set to approximately one third of the full-scale signal range of the FM signal.

22. The Apparatus of claim 14 wherein the VCO is operatively coupled to a switched capacitor network.

23. The Apparatus of claim 22 wherein the amplitude of the coarse FM signal value is proportional to a frequency step produced by the VCO and the switched capacitor network.

24. An Apparatus for processing an FM signal component of a modulation signal in a polar modulator, comprising:
 a detection circuit configured to determine when the FM signal exceeds a threshold value;
 a coarse signal generation circuit configured to generate, responsive to said determining, one or more digital bit streams representing one or more coarse FM signals representative of one or more a plurality of threshold values when the FM signal exceeds one or more threshold values; and
 a residue signal generation circuit configured to generate a residue FM signal corresponding to the difference between the FM signal and said one or more coarse FM signals.

25. The Apparatus of claim 24 wherein said one or more digital bit streams and the residue FM signal are provided to a voltage controlled oscillator (VCO) circuit to facilitate generation of a transmit modulation signal.

26. The Apparatus of claim 25 further comprising a switching circuit configured to switch, responsive to the one or more digital bit streams, a tuned frequency of the VCO circuit.

27. The Apparatus of claim 26 wherein the switching circuit comprises two or more coarse tuning capacitors.

28. The Apparatus of claim 25 wherein the residue FM signal is provided to a tuning port of the VCO.

* * * * *